US012566203B2

(12) United States Patent

Herbsommer et al.

(10) Patent No.: US 12,566,203 B2

(45) Date of Patent: Mar. 3, 2026

(54) ELECTRIC FIELD SENSOR HAVING A GAS CELL

(71) Applicant: TEXAS INSTRUMENTS INCORPORATED, Dallas, TX (US)

(72) Inventors: Juan Herbsommer, Allen, TX (US); Baher Haroun, Allen, TX (US); Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 50 days.

(21) Appl. No.: 18/500,184

(22) Filed: Nov. 2, 2023

(65) Prior Publication Data

US 2025/0147089 A1     May 8, 2025

(51) Int. Cl.
*G01R 29/12*     (2006.01)

(52) U.S. Cl.
CPC .................................... *G01R 29/12* (2013.01)

(58) Field of Classification Search
CPC ......................................................... G01R 29/12
USPC ......................................................... 324/457
See application file for complete search history.

(56) References Cited

U.S. PATENT DOCUMENTS

2007/0209446 A1*   9/2007   Stewart .................. G01N 27/22
                                                          73/780
2010/0211347 A1*   8/2010   Friedrich ........... G01R 33/0035
                                                          324/202
2013/0134965 A1*   5/2013   Friedrich ........... G01R 33/0023
                                                          324/202
2015/0323612 A1*  11/2015   Latham .............. G01R 33/0041
                                                          324/252
2017/0014070 A1*   1/2017   Holmes ................ A61B 5/1126
2021/0188450 A1*   6/2021   Inkpen .................. G08B 19/02

OTHER PUBLICATIONS

Fabrication of Tubular Anti-Resonant Hollow Core Fibers: Modelling, Draw Dynamics and Process Optimization, Gregory T. Jason et al., Optics Express vol. 27, No. 15, Jul. 22, 2019.
Low-Loss Single-Mode Hybrid-Lattics Hollow-Core Photonic-Crystal Fibre, Foued Amrani, et al., Light: Science & Application, Official Journal of the CIOMP 2047-7538, 2021.

* cited by examiner

*Primary Examiner* — Raul J Rios Russo
(74) *Attorney, Agent, or Firm* — Zhenhai Fu; Frank D. Cimino

(57)     ABSTRACT

An electric field sensor includes a gas cell having a first terminal and a second terminal. A ground plane is proximate the gas cell. A transmitter has an input and an output. The transmitter's output is communicatively coupled to the first terminal of the gas cell. A receiver has an input and an output. The receiver's input is communicatively coupled to the second terminal. A processing circuit has a processing circuit input and a processing circuit output. The processing circuit input is coupled to the output of the receiver, and the processing circuit output is coupled to the input of the transmitter.

25 Claims, 6 Drawing Sheets

200

202

110

600

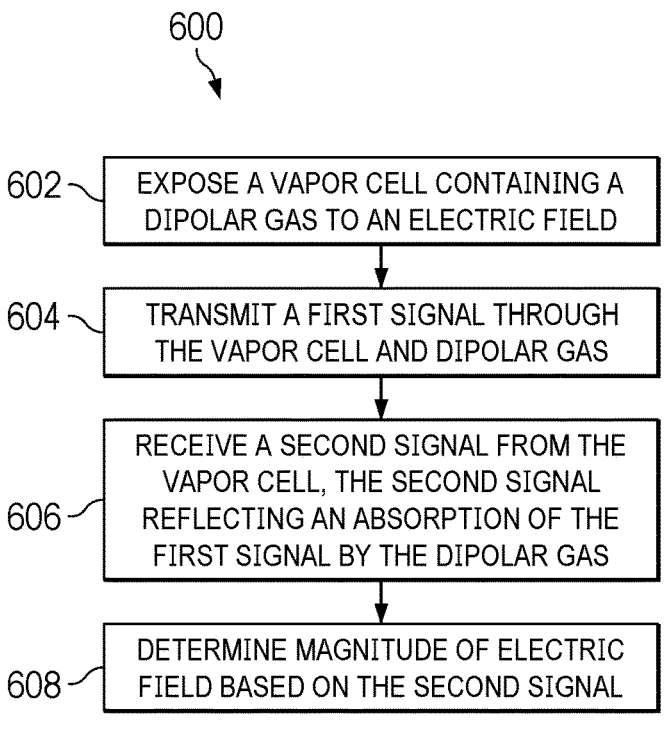

602 ─ EXPOSE A VAPOR CELL CONTAINING A DIPOLAR GAS TO AN ELECTRIC FIELD

604 ─ TRANSMIT A FIRST SIGNAL THROUGH THE VAPOR CELL AND DIPOLAR GAS

606 ─ RECEIVE A SECOND SIGNAL FROM THE VAPOR CELL, THE SECOND SIGNAL REFLECTING AN ABSORPTION OF THE FIRST SIGNAL BY THE DIPOLAR GAS

608 ─ DETERMINE MAGNITUDE OF ELECTRIC FIELD BASED ON THE SECOND SIGNAL

FIG. 6

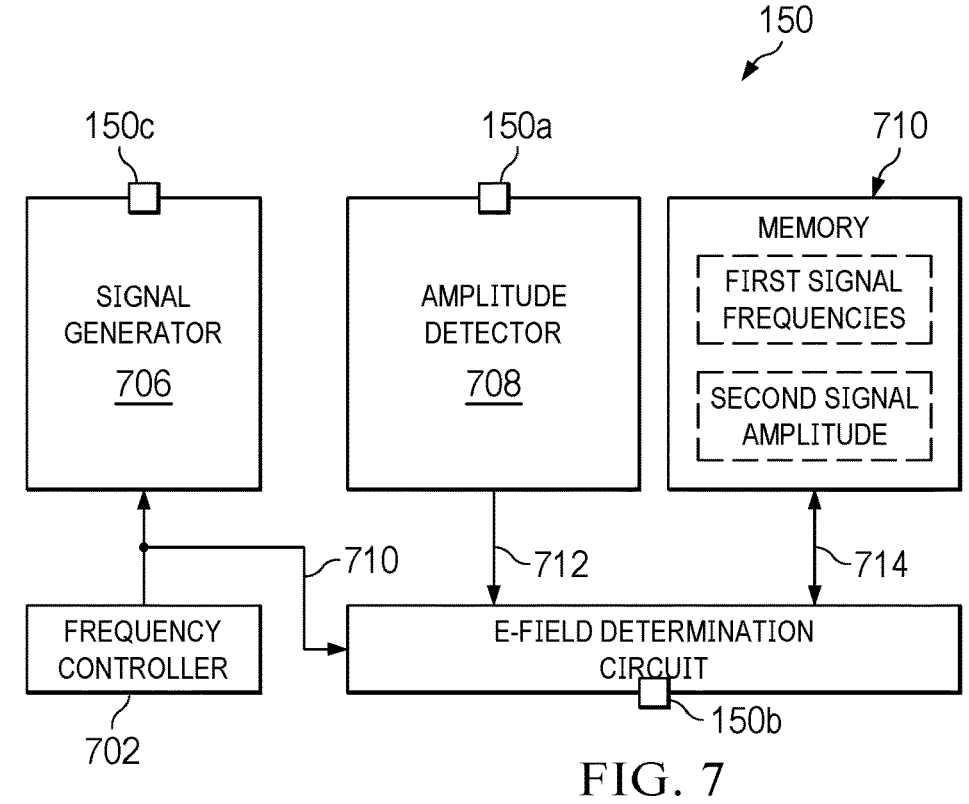

150

150c

150a

710

SIGNAL GENERATOR 706

AMPLITUDE DETECTOR 708

MEMORY

FIRST SIGNAL FREQUENCIES

SECOND SIGNAL AMPLITUDE

FREQUENCY CONTROLLER 702

710

712

714

E-FIELD DETERMINATION CIRCUIT

ELECTRIC FIELD SENSOR HAVING A GAS CELL

BACKGROUND

To determine if a transmission power line has fallen, been severed, or otherwise damaged, the voltage of the transmission line could be measured. However, transmission power lines can carry relatively high voltages such as thousands, tens of thousands, or even hundreds of thousands of volts. Instrumenting the transmission lines with equipment that can directly measure the voltage of the transmission line is problematic due to the high voltages involved. Measuring electric fields is more adequate but such devices are difficult and expensive to create.

SUMMARY

An electric field sensor includes a gas cell having a first terminal and a second terminal. A ground plane is proximate the gas cell. A transmitter has an input and an output. The transmitter's output is communicatively coupled to the first terminal of the gas cell. A receiver has an input and an output. The receiver's input is communicatively coupled to the second terminal. A processing circuit has a processing circuit input and a processing circuit output. The processing circuit input is coupled to the output of the receiver, and the processing circuit output is coupled to the input of the transmitter.

BRIEF DESCRIPTION OF THE DRAWINGS

FIG. 6 is a flow diagram of a method for determining the magnitude of an E-field using a gas cell, in an example.

FIG. 7 is a block diagram of a processing circuit to determine the magnitude of the E-field using the gas cell, in an example.

DETAILED DESCRIPTION

Figure 1:
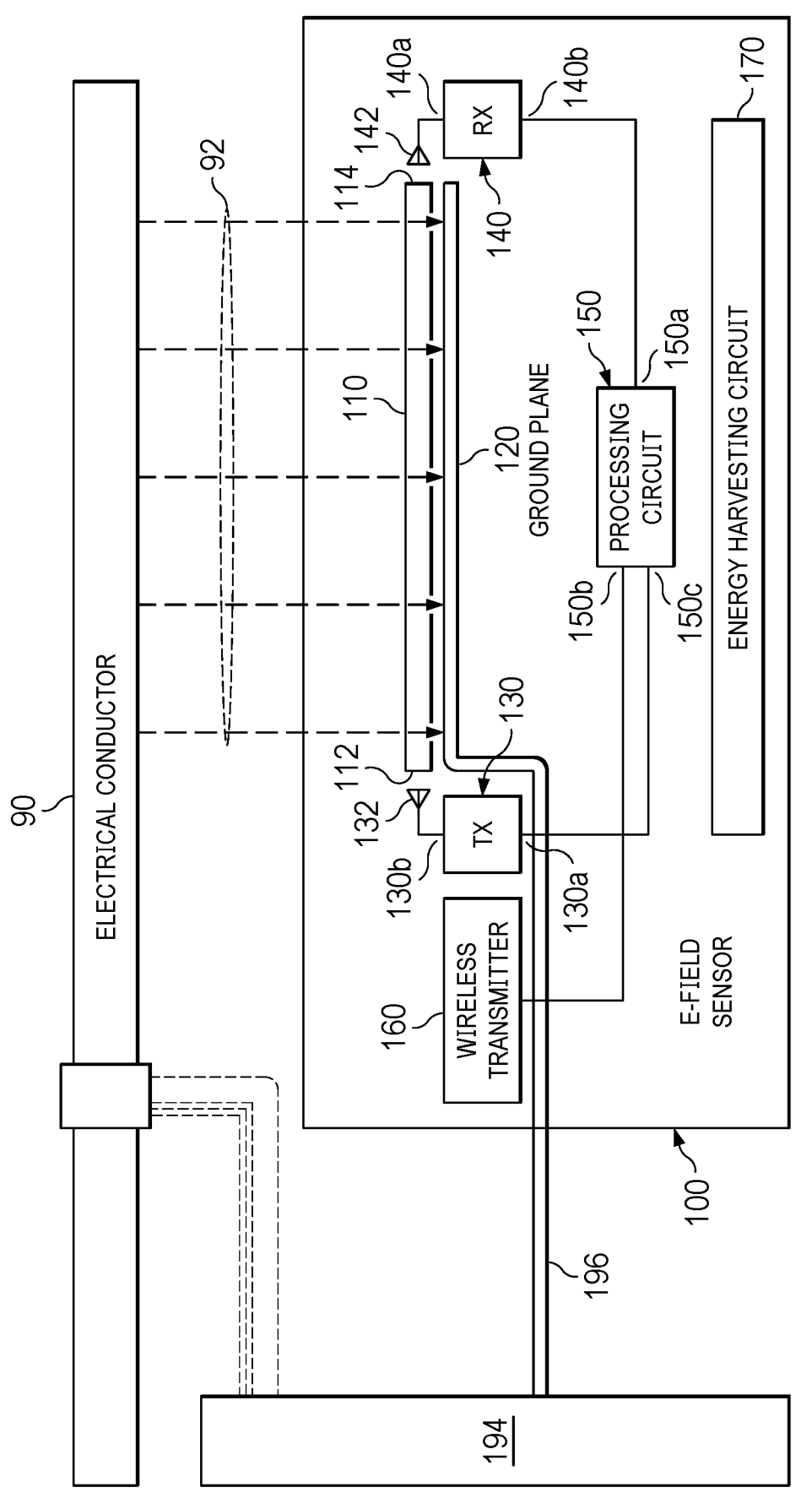
FIG. 1 is a block diagram of an electric field (E-field) sensor for measuring the electric field around a power conductor, in an example.

The same reference numbers or other reference designators are used in the drawings to designate the same or similar (either by function and/or structure) features.

The examples described herein are directed to an electric field (E-field) sensor that measures the electric field produced by an electrical conductor, e.g., a high voltage power line. The magnitude of the electric field produced by current flowing through the electrical conductor is a function of the voltage of the electrical conductor. Accordingly, the voltage of the electrical conductor in the vicinity of the E-field sensor can be determined from the measurement of the electric field. In one use-case, damage to the electrical conductor can be inferred based on the E-field measurements and/or voltage determinations. The E-field sensor described herein can be useful to measuring the E-field of a high voltage transmission line. The E-field sensor can also be used to measure the E-field of other types of electrical conductors.

Figure 8:
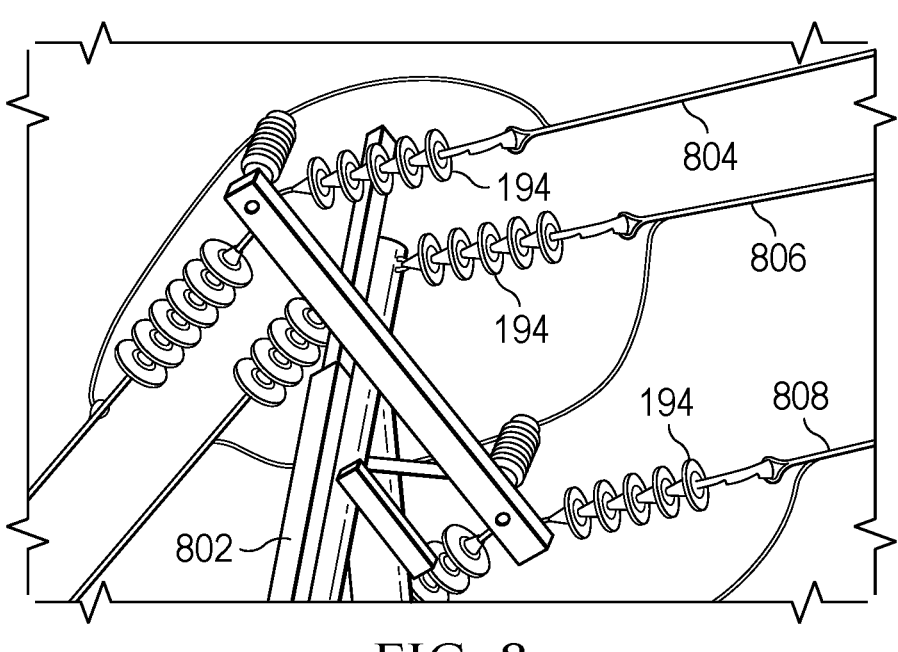
FIGS. 8 and 9 are images illustrating a use-case of the E-field sensor for determining the magnitude of an E-field generated by a power transmission line supported by a utility pole, in an example.
Figure 9:
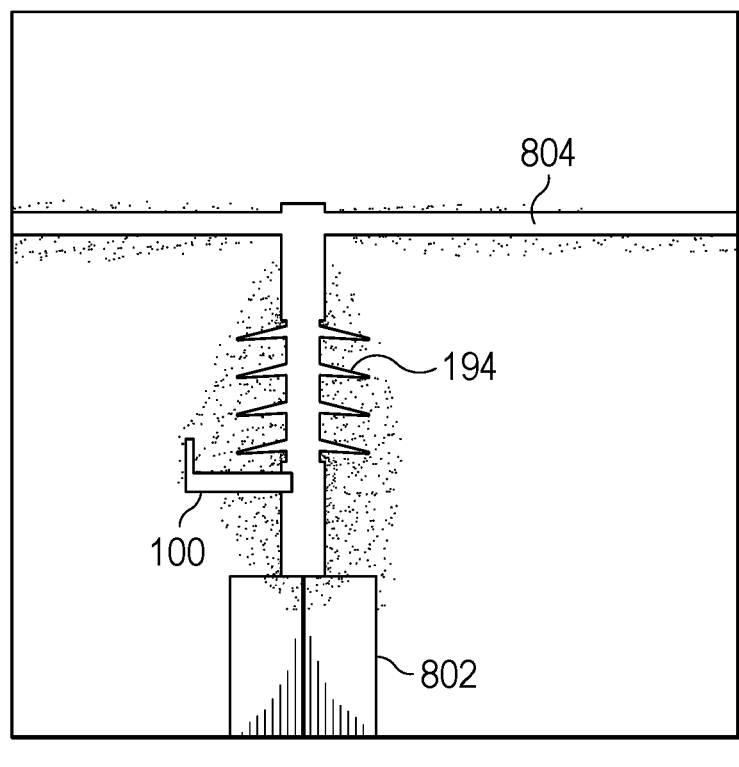

FIG. 1 is a block diagram of an E-field sensor 100 attached to, for example, an insulator 194. The insulator 194, an example of which is shown in FIGS. 8 and 9 and described below, can be attached to an electrical conductor 90 such as a high voltage transmission line. Current flowing in the electrical conductor 90 produces an E-field 92 with respect to ground plane 120. E-field sensor 100 determines the magnitude of the E-field 92 produced by the electrical conductor 90.

In the example of FIG. 1, E-field sensor 100 includes a gas cell 110, a ground plane 120, a transmitter (TX) 130, a receiver (RX) 140, a processing circuit 150, a wireless transmitter 160, and an energy harvesting circuit 170. Gas cell 110, ground plane 120, TX 130, RX 140, processing circuit 150, wireless transmitter 160, and energy harvesting circuit 170 can be housed in an enclosure 190. A support structure 196, e.g., a bracket, can attach E-field sensor to the insulator 194 or another structure to which E-field sensor is attached. Gas cell 110 includes a first terminal 112 and a second terminal 114. Each of first terminal 112 and second terminal 114 can include an aperture that is translucent or substantially transparent to electromagnetic (EM) signals. Ground plane 120 can be proximate gas cell 110. Ground plane 120 can be on a side of gas cell 110 opposite the electrical conductor 90 so that at least some of the E-field generated by the electrical conductor 90 passes through gas cell 110 to the ground plane. In some examples, ground plane 120 can support gas cell 110 within enclosure 190. Ground plane 120 can have a planar surface, or a curved surface concentric to the cable, so that the electric field lines are not deformed in the vicinity of the gas cell.

Transmitter 130 has an input 130a and an output 130b. Receiver 140 has an input 140a and an output 140b. Processing circuit 150 has a processing circuit input 150a and processing circuit outputs 150b and 150c. In the example of FIG. 1, output 130b of TX 130 is coupled to the first terminal 112 of gas cell 110 through an antenna 132. The second terminal 114 of gas cell 110 is coupled to input 140a of RX 140, e.g., through an antenna 142. Output 140b of RX 140 is coupled to processing circuit input 150a. Processing circuit output 150b is coupled to input 130a of TX 130. Processing circuit output 150c is coupled to wireless transmitter 160.

Energy harvesting circuit 170 can provide electrical power for TX 130, RX 140, processing circuit 150, and wireless transmitter 160. In one example, energy harvesting circuit 170 may have a coil in which current is induced from E-field 92. Energy harvesting circuit 170 may have power conditioning circuitry, e.g., rectifiers, voltage converters, filters, etc. to produce a suitable voltage and current to power based on the current induced in the coil. In another example, energy harvesting circuit 170 may include a solar cell to convert solar energy into electrical power to power TX 130, RX 140, processing circuit 150, and wireless transmitter 160. In yet another example, energy harvesting circuit 170 may include a battery.

Wireless transmitter 160 can wirelessly transmit a value indicative of the magnitude of the E-field as determined by processing circuit 150. In one example, wireless transmitter 160 includes a transmitter and antenna that can transmit signals on a cellular network. Alternatively, wireless transmitter 160 includes a transmitter and antenna that can transmit signals on a WiFi network.

In one example, transmitter 130, receiver 140, and processing circuit 150 can be fabricated on a single semiconductor die (integrated circuit "IC"). Wireless transmitter 160 may be a separate component from the IC containing transmitter 130, receiver 140, and processing circuit 150. In another example, each of the components of E-field sensor 100 shown in FIG. 1 can be implemented as separate components coupled to a printed circuit board or other support structure.

As described below, processing circuit 150 can determine the magnitude of the E-field 92 to which the E-field sensor 100 is exposed. The processing circuit 150 may perform this determination at a predetermined or programmed periodicity, for example, once per second, once per minute, once every 5 minutes, etc. In one example, processing circuit 150 may use wireless transmitter 160 to transmit a value indicative of each E-field magnitude it determines. In another example, processing circuit 150 may use wireless transmitter 160 to transmit a value indicative of an E-field magnitude only if the E-field magnitude deviates by more than a threshold amount from a previously determined E-field magnitude.

In some examples, gas cell 110 includes a sealed container enclosing a gas. The container can be made of various dielectric materials, such as glass, plastic, silicon, etc. In some examples, the gas is a dipolar gas including gas molecules such as, e.g., propyne, isocyanic acid, or difluoroethane. Depending on the pressure and the temperature inside gas cell 110, the dipolar gas in gas cell 110 can be in a gaseous state or in a vapor state. For example, in a case where the dipolar gas in gas cell 110 has a relatively low internal pressure (e.g., 0.2 mbar), the dipolar gas can be in a gaseous state.

Figure 2A:
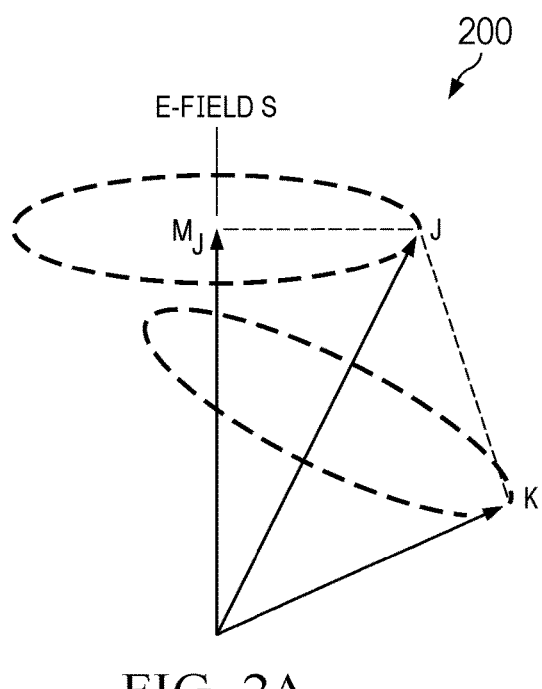
FIGS. 2A and 2B are plots illustrating Starks effect based on which a gas cell can be operated as part of the electric field sensor of FIG. 1, in an example.
Figure 2B:
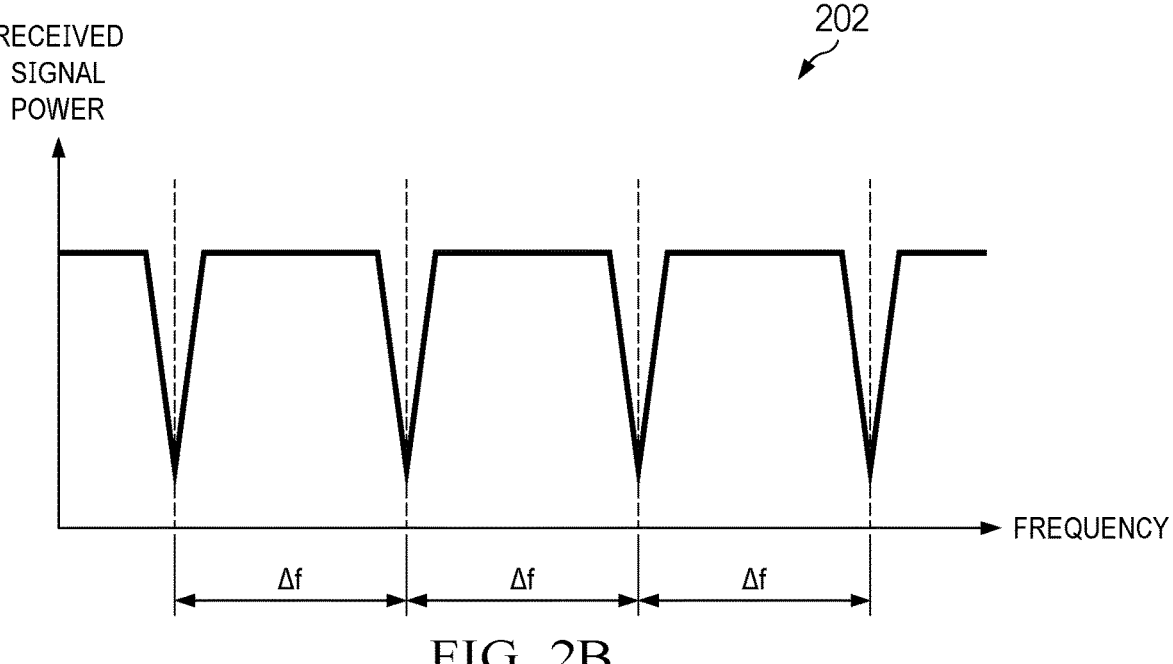

The dipolar gas in gas cell 110, whether in the gaseous state or in the vapor state, can exhibit the molecular Stark effect with subject to an E-field. FIG. 2A and FIG. 2B are graphs that provide example illustration of the molecular Stark effect. Referring to graph 200 of FIG. 2A, the Stark effect occurs in rotational transitions of symmetric top molecules. In first approximation a molecule may be seen as a rigid rotor. A symmetric top rigid rotor has the unperturbed eigenstates with quantum numbers J, K and M (for a state |JKM>) that defines the quantum rotational state. Referring to graph 202 of FIG. 2B, under the effect of an E-field having the strength S, the quantum transition |JKM>lifts its degeneracy and splits in many transitions in what it is known as molecular Stark effect. Each one of these quantum absorptions are separated by Δf according to the following linear dependency (first order Stark effect):

$$E = h \times \Delta f = -\frac{\mu \times S \times K \times M}{J(J+1)} \qquad \text{(Equation 1)}$$

In Equation 1, E is the amount of energy absorbed by the molecules to support the rotational transition, h is the Planck's constant, u is the molecular dipolar moment, S is the strength of the E-field, and K, M, and J are the quantum numbers defining the quantum rotation state. Accordingly, Δf can be proportional to S. By measuring Δf between peak absorption of the EM signal the strength/magnitude of the E-field can be determined. The gases listed above-propyne, isocyanic acid, or difluoroethane—have enough sensitivity to be able to measure relatively low magnitude E-fields. In one example, E-field sensor 100 can measure E-fields of 0.23V/micrometers at a distance of 30 centimeters from the electrical conductor generating the E-field.

Figure 3:
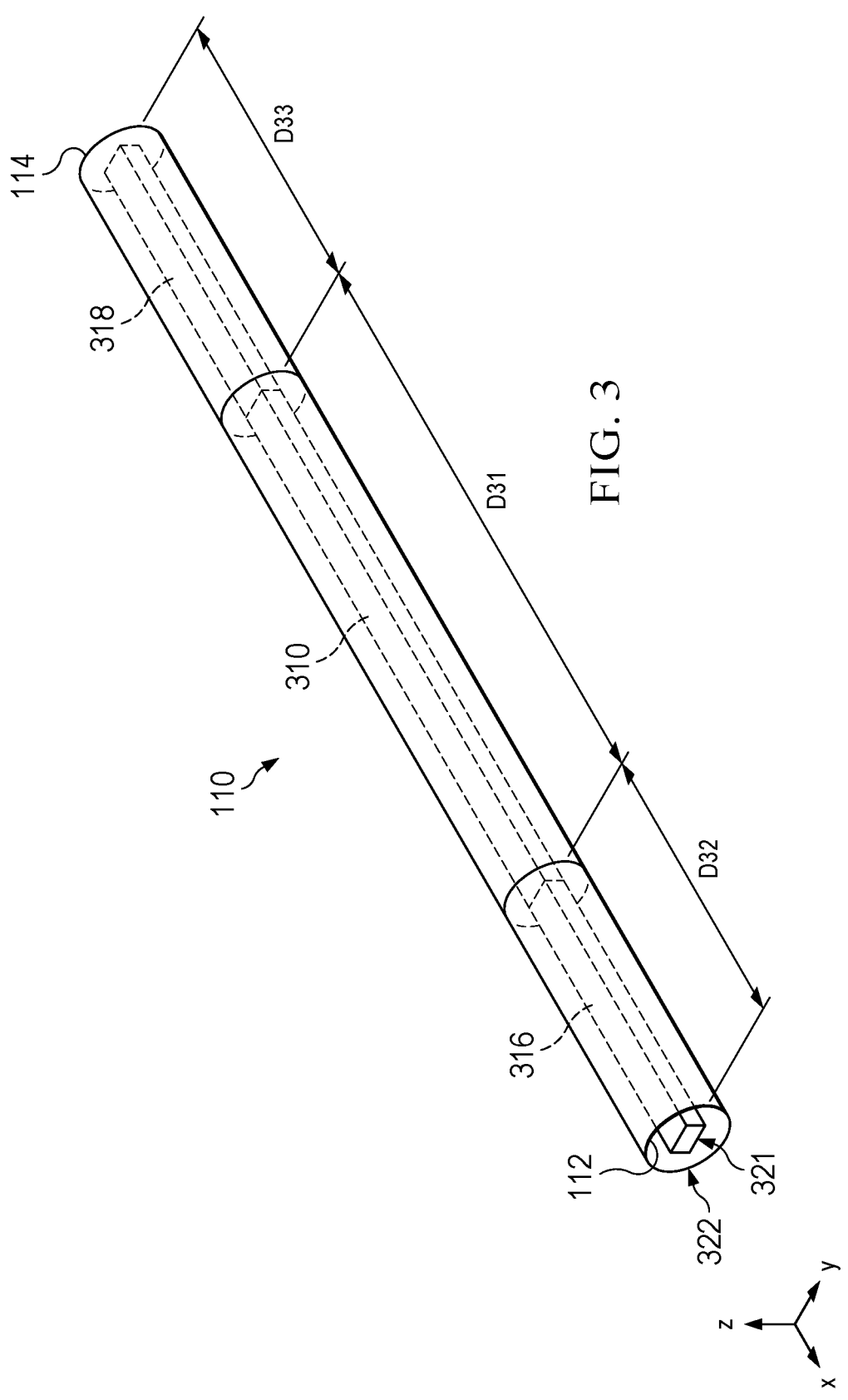
FIG. 3 is a schematic diagram of a gas cell, in an example.

FIG. 3 is a view of an example gas cell 110. In this example, gas cell 110 includes a gas container structure 310, a first dielectric waveguide 316, and a second dielectric waveguide 318. The first dielectric waveguide 316 has the first terminal 112 (or can be part of first terminal 112), and the second dielectric waveguide 318 has the second terminal 114 (or can be part of second terminal 114). A first signal can be provided by processing circuit 150 to one terminal, e.g., the first terminal 112 of the first dielectric waveguide 316 via TX 130. Depending on the electric field that propagates through the gas cell (if any), at certain frequencies the first signal passing through gas cell 110 may be absorbed by the dipolar gas molecules to support the quantum transition due to Starks effect as described above, while at other frequencies the first signal is not absorbed. Processing circuit 150 may receive a second signal, which can represent part of the first signal that is not absorbed by the dipolar gas in gas cell 110, from the second terminal 114 of the second dielectric waveguide 318 via RX 140. As explained below, processing circuit 150 can determine the magnitude/strength of the E-field based on the second signal from RX 140. The gas container structure 310 has a length D31. First and second dielectric waveguides 316 and 318 have lengths D32 and D33, respectively. The lengths D31, D32, and D33 are application-specific. In one example, D31 is 40 millimeters (mm) and lengths D32 and D33 are 20 mm each.

Each of gas container structure 310 and the first and second dielectric waveguides 316 and 318 include an inner structure 321 surrounded by an outer structure 322. The inner structures 321 of the gas container structure 310 and the first and second dielectric waveguides 316 and 318 are generally in alignment with each other as shown in FIG. 2.

Figure 4:
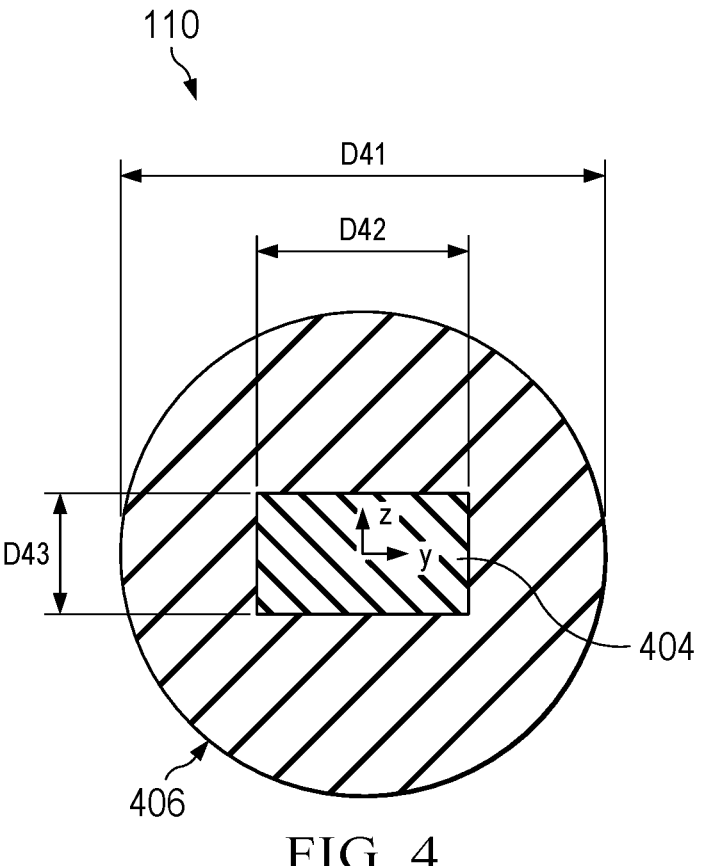
FIGS. 4 and 5 are cross-sectional views of the gas cell, in examples.

FIG. 4 is a cross-sectional view of gas cell 110. The cross-sectional view of FIG. 4 is usable to describe an example construction of the dielectric waveguides 316 and 318 and the gas container structure 310. The structure shown in FIG. 4 includes an inner structure 404 surrounded by an outer structure 406.

For the gas container structure 310, the inner structure 404 is inner structure 321 (FIG. 3) and the outer structure 406 is the outer structure 322. The inner structure 404 or the gas container structure 310 is a material that has a different dielectric constant than the outer structure 406. The different dielectric constants between inner structure 404 (or gas container structure 310) and outer structure 322 can trap the EM signal inside gas container structure 310 and inner structure 404 through internal reflection as the EM signal propagates through gas cell 110. By trapping the EM signal inside gas container 310, more energy can be absorbed by the dipolar gas in the gas cell for the rotational transitions, which can facilitate the measurement of the different frequencies at which peak absorption occurs due to the molecular Stark effect. Also, the inner structure 404, the outer structure 406, as well as the gas container 310 are transparent to the external E-field, which exposes the dipolar gas molecules to the external E-field and allows the dipolar gas molecules to exhibit the aforementioned molecular Stark effect by absorbing the EM signal at certain frequencies for the rotational transitions while being subject to the external E-field.

In one example, the inner structure 404 of the gas container 310 is a polymer having a dielectric constant of approximately 2.6 to 3.8, while the outer structure 406 has a dielectric constant of 2.1. The gas cell can be made of a thin glass (e.g., 100 μm thick) having a low loss tangent to avoid dielectric loss. The outer structure 406 for both the gas container structure 310 and the dielectric waveguides 316 and 318 can include a plastic cladding, fibers, or a photonic structure. In some examples, the inner structure 404 can have a lower dielectric constant than the outer structure 406.

Figure 5:
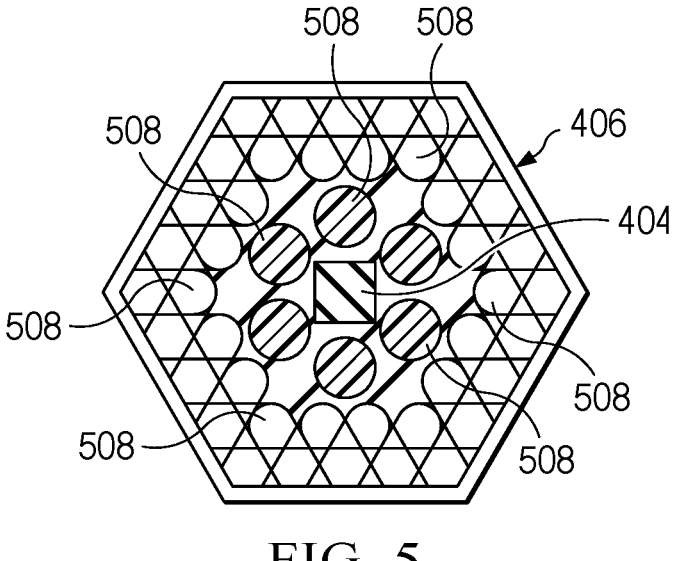

FIG. 5 is a cross-sectional view gas container structure 310 in another example. In this example, the outer structure 406 includes fibers 508. Fibers 508 may include plastic, glass, or other material that is transparent to E-field. In some examples, fibers 508 can be arranged to provide a photonic structure. The fiber can have a hexagonal cross section (as shown in FIG. 5) or other cross section shapes.

FIG. 6 is a flow diagram 600 illustrating a method 600 for determining the magnitude of an electric field using the E-field sensor 100, in an example. In operation 602 the method includes exposing the gas cell, e.g., gas cell 110, to an electric field. The gas cell includes a dipolar gas as described above. The electric field is generated externally to the gas cell. In one example, the electric field can be generated by a transmission power line.

In operation 604, the method can include transmitting a first signal through the gas cell and dipolar gas. In one example, the processing circuit 150 generates the first signal and provides it to transmitter 130, which then provides the first signal to gas cell 110 via antenna 132 and first terminal 112. In one example, the processing circuit 150 generates the first signal as a single tone (single frequency) signal, and the processing circuit 150 can vary the frequency of the first signal between a first frequency and a second frequency at different times according to a frequency sweep sequence. The second frequency may be larger than the first frequency—the frequency sweep sequence includes increasing the frequency of the first signal in steps. Alternatively, the second frequency May be smaller than the first frequency—the frequency sweep sequence includes decreasing the frequency of the first signal. Processing circuit 150 can include a frequency synthesizer circuit to generate the single tone first signal and set the frequency of the single tone first signal.

In another example, the first signal generated by the processing circuit 150 can be a multi-tone signal including multiple frequencies separated by a particular frequency difference. The processing circuit 150 can include a frequency modulator circuit to generate a multi-tone first signal, and set the frequency difference between the multiple frequencies of the multi-tone first signal.

In operation 606, the method includes receiving a second signal from the gas cell. The second signal can represent at least part of the first signal that propagates through the gas cell and is not absorbed by the dipolar gas in the gas cell, and the part of the first signal is received via antenna 142 and second terminal 114 as the second signal.

In operation 608, the method includes determining the magnitude of the E-field based on the second signal. As explained above with to Equation 1, the difference between frequencies (Δf) at which peak absorption of the first signal occurs can be proportional to the strength of the E-field. Accordingly, the processing circuit 150 can determine the amplitude/power of the second signal as a function of the frequency of the first signal, identify the frequencies at which peak absorption of the first signal takes places based on determining the frequencies of the first signal at which minimum amplitude/power of the second signal is detected, and determining the frequency difference Δf between the adjacent ones of the frequencies.

Specifically, in a case where processing circuit 150 provides a single tone first signal, processing circuit 150 can adjust the frequency of the first signal in steps, measure the amplitude/power of the second signal at each frequency step, and generate a set of measurements of the amplitude/ power of the second signal as a function of frequency similar to as illustrated in graph 202 of FIG. 2B. Processing circuit 150 can identify the peak absorption of the first signal by identifying minimum amplitude/power of the second signal, as well as the frequencies of the first signal at which the amplitude/power of the second signal is at a minimum. Processing circuit 150 can then determine the frequency difference Δf between the adjacent ones of the frequencies, and compute the magnitude of the E-field based on Δf and Equation 1 described above.

Also, in a case where processing circuit 150 provides a multi-tone first signal, processing circuit 150 can adjust the frequencies of the multi-tone first signal, as well as the frequency difference between adjacent tones of the first signal, and measure the amplitude/power of the second signal. Processing circuit 150 can identify the peak absorption of the first signal by identifying minimum amplitude/ power of the second signal among all combinations of frequencies of the tones and frequency differences between adjacent tones. After finding the combination of frequencies and frequency difference Δf that give rise to the minimum amplitude/power of the second signal, processing circuit 150 can use the frequency difference Δf to compute the magnitude of the E-field based on Equation 1 described above.

FIG. 7 is a schematic diagram of processing circuit 150, in an example. Referring to FIG. 7, processing circuit 150 can include a frequency controller 702, an E-field determination circuit 704, a signal generator 706, an amplitude detector 708, and a memory 710. In at least one example, processing circuit 150 is part of an application specific integrated circuit (ASIC). In at least one example, processing circuit 150 includes one or more physical processor devices executing instructions stored in non-transitory memory to perform some of the functions of processing circuit 150.

Signal generator 706 can include a frequency synthesizer and/or a frequency modulator, and can generate the first signal and provide the first signal via processing circuit output 150c to transmitter 130. Signal generator 706 can receive a signal 710 from frequency controller 702 indicating a frequency of the first signal. In a case where first signal is a single tone signal, frequency controller 702 can provide signal 710 indicating a single frequency at a time, and sweep the frequency according to a frequency sweep sequence. In a case where first signal is a multi-tone signal, frequency controller 702 can provide signal 710 indicating, for example, the center frequency and the amount of frequency modulation. Frequency controller 702 can also vary the center frequency and the amount of frequency modulation to provide different combinations of frequencies and separations between the frequencies. Frequency controller 702 can also provide signal 710 to E-field determination circuit 704, which can track the different frequencies of the first signal.

Also, amplitude detector 708 is coupled to processing circuit input 150a to receive the second signal, which represents the part of the first signal not absorbed by the dipolar gas in gas cell 110. Amplitude detector 708 can detect the amplitude (or power) of the second signal. In some examples, amplitude detector 708 can include, for example, a rectifier to convert the second signal to a DC signal, and an analog-to-digital converter (ADC) to sample the rectified second signal and generate a digital representation of the rectified second signal. Amplitude detector 708 can provide a signal 712 representing the amplitude of the second signal.

E-field determination circuit 704 can receive signal 710 from frequency controller 702 and signal 712 from amplitude detector 708. In a case where frequency controller 702 performs a frequency sweep of the single tone first signal, E-field detection circuit 704 can generate a mapping between different frequencies of the first signal and different amplitudes of the second signal received for the first signal having the different frequencies. In a case where frequency controller 702 provides a multi-tone first signal, E-field detection circuit 704 can generate a mapping between different amplitudes of the second signal, and different combinations of frequencies and frequency differences of the multiple tones of the first signal. From the mapping, E-field determination circuit 704 can determine the frequency difference that lead to a minimum amplitude of the second signal, and compute the amplitude/strength of the E-field based on the frequency difference and Equation 1 above. E-field determination circuit 704 can provide a signal representing the amplitude/strength of the E-field at processing circuit output 150*b*.

FIGS. 8 and 9 illustrate an example use-case for E-field sensor 100. FIG. 7 is an image of a utility pole 802 carrying power transmission lines 804, 806, and 808 and insulators 194. Insulators 194 are not electrically conductive and hold the transmission lines 804, 806, and 808 to utility pole 802. Accordingly, insulators 194 are close to utility pole 802 and are a suitable structure to which to support an E-field sensor 100. FIG. 9 is a view in which an E-field sensor 100 is attached to an insulator 194. Because insulator 194 is close to the power transmission line (e.g., power transmission line 804), E-field sensor 100 also is sufficiently close to the power transmission line to determine the magnitude of the E-field generated by the power transmission line.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. An electric field sensor, comprising:

a gas cell or a vapor cell having a first terminal and a second terminal;

a conductor adjacent to the gas cell or the vapor cell;

a transmitter having an input and an output, the output communicatively coupled to the first terminal of the gas cell or the vapor cell;

a receiver having an input and an output, the input of the receiver communicatively coupled to the second terminal; and a processing circuit having an input and an output, the input of the processing circuit coupled to the output of the receiver, and the output of the processing circuit coupled to the input of the transmitter.

2. The electric field sensor of claim 1, wherein the processing circuit is configurable to provide a first signal to the transmitter and determine a magnitude of an electric field between an external source and the conductor based on a second signal from the receiver.

3. The electric field sensor of claim 2, wherein the second signal reflects a degree of absorption of the first signal by a gas in the gas cell or by a vapor in the vapor cell subject to the electric field, and the processing circuit is configurable to determine the magnitude of the electric field based on:

determining an amplitude of the second signal;

determining frequencies of the first signal at which peak absorption of the first signal occurs based on the amplitude of the second signal;

determining a difference between adjacent ones of the frequencies; and determining the magnitude of the electric field based on the difference.

4. The electric field sensor of claim 2, wherein the processing circuit is configurable to provide the first signal as a single tone signal and vary a frequency of the first signal between a first frequency and a second frequency according to a frequency sweep sequence.

5. The electric field sensor of claim 2, wherein the processing circuit is configurable to provide the first signal as a multi-tone signal.

6. The electric field sensor of claim 2, further comprising a wireless transceiver configurable to transmit a signal representing the magnitude of the electric field.

7. The electric field sensor of claim 2, further comprising an energy harvesting circuit configurable to convert the electric field to electric power, and supply the electric power to the transmitter, the receiver, and the processing circuit.

8. The electric field sensor of claim 1, wherein the gas cell or the vapor cell includes:

a container containing a gas or a vapor; and a dielectric enclosure around the container.

9. The electric field sensor of claim 8, wherein the dielectric enclosure includes a plastic cladding.

10. The electric field sensor of claim 8, wherein the dielectric enclosure includes fibers.

11. The electric field sensor of claim 8, wherein the dielectric enclosure includes a photonic structure.

12. The electric field sensor of claim 8, wherein the container has a different dielectric constant from the dielectric enclosure.

13. The electric field sensor of claim 8, further comprising:

a first dielectric waveguide coupled between the output of the transmitter and a first end of the container; and a second dielectric waveguide coupled between the output of the transmitter and a second end of the container, wherein the first and second dielectric waveguides are surrounded by the dielectric enclosure.

14. The electric field sensor of claim 13, wherein each of the first and second dielectric waveguides has a different dielectric constant from the dielectric enclosure.

15. The electric field sensor of claim 1, wherein the gas cell has a gas or the vapor cell has a vapor, and the gas or the vapor including at least one of propyne, isocyanic acid, or difluoroethane.

16. The electric field sensor of claim 1, further comprising an enclosure enclosing the gas cell or the vapor cell, the conductor, the transmitter, the receiver, and the processing circuit, wherein the electric field sensor further comprises a support structure that extends out of the enclosure and is electrically coupled to the conductor.

17. The electric field sensor of claim 1, wherein the conductor is electrically coupled to ground.

18. A method, comprising:

causing an electric field to propagate through a container containing a dipolar gas or a dipolar vapor to a ground plane;

transmitting, using a transmitter, a first signal through the container and the dipolar gas or the dipolar vapor;

receiving, using a receiver, a second signal from the container, the second signal indicating a degree of absorption of the first signal by a gas or a vapor in the container due to the electric field; and determining, by a processing circuit, a magnitude of the electric field based on the second signal.

19. The method of claim 18, wherein determining the magnitude of the electric field based on the second signal comprises:

determining an amplitude of the second signal;

determining frequencies of the first signal at which peak absorption of the first signal occurs based on the amplitude of the second signal;

determining a difference between adjacent ones of the frequencies; and determining the magnitude of the electric field based on the difference.

20. The method of claim 18, further comprising generating the first signal as a single tone signal, and varying a frequency of the first signal between a first frequency and a second frequency according to a frequency sweep sequence.

21. The method of claim 18, further comprising generating the first signal as a multi-tone signal.

22. An apparatus, comprising:

a transmitter having an input and an output, the output coupled to a first gas cell or vapor cell terminal, the transmitted configurable to provide a first signal at the output of the transmitter;

a receiver having an input and an output, the input coupled to a second gas cell or vapor cell terminal, the receiver configurable to receive a second signal at the input of the receiver; and a processing circuit having a processing circuit input and a processing circuit output, the processing circuit input coupled to the output of the receiver, and the processing circuit output coupled to the input of the transmitter, the processing circuit configurable to:

provide the first signal to the transmitter;

receive the second signal from the receiver, the second signal representing a part of the first signal; and determine a magnitude of an electric field based on the second signal.

23. The apparatus of claim 22, further comprising:

a gas cell or a vapor cell coupled to the first gas cell or vapor cell terminal and to the second gas cell or vapor cell terminal; and a conductor adjacent to the gas cell or the vapor cell, wherein the electric field passes through the gas cell or the vapor cell to the conductor.

24. The apparatus of claim 23, wherein the second signal represents the part of the first signal not absorbed by a gas in the gas cell or by a vapor in the vapor cell.

25. The apparatus of claim 23, wherein the conductor is a first conductor configurable as a ground plane, and the apparatus comprises:

an enclosure enclosing the gas cell or the vapor cell, the
transmitter, the receiver, and the processing circuit;

a pole;

a second conductor coupled to the pole and configurable
as a transmission line; and a support structure coupled to the pole and the enclosure, wherein the electric field passes from the second conductor through the gas cell or the vapor cell to the first
conductor.

* * * * *